(12) United States Patent
Humbs

(10) Patent No.: US 6,924,025 B2
(45) Date of Patent: Aug. 2, 2005

(54) MATRIX ARRANGEMENT OF ORGANIC MATERIAL LAYERS AND ELECTRODES INCLUDING PIXELS

(75) Inventor: Werner Humbs, Berlin (DE)

(73) Assignee: Samsung SDI Co., Ltd., Suwon (KR)

(*) Notice: Subject to any disclaimer, the term of this patent is extended or adjusted under 35 U.S.C. 154(b) by 53 days.

(21) Appl. No.: 10/085,619

(22) Filed: Mar. 1, 2002

(65) Prior Publication Data

US 2002/0145381 A1 Oct. 10, 2002

(30) Foreign Application Priority Data

Apr. 9, 2001 (DE) .......................... 101 17 663

(51) Int. Cl.$^7$ ............................... H01L 33/00
(52) U.S. Cl. .................... 428/167; 428/156; 428/172; 257/40; 257/88; 257/89
(58) Field of Search ................. 428/156, 167, 428/172; 257/40, 88, 89, 93, 98; 313/483

(56) References Cited

U.S. PATENT DOCUMENTS

| | | |
|---|---|---|
| 4,720,432 A | 1/1988 | VanSlyke et al. |
| 4,769,292 A | 9/1988 | Tang et al. |
| 5,693,962 A * | 12/1997 | Shi et al. ............... 257/89 |
| 5,707,745 A * | 1/1998 | Forrest et al. ........... 428/432 |
| 5,742,129 A | 4/1998 | Nagayama et al. |
| 5,869,350 A | 2/1999 | Heeger et al. |
| 6,087,196 A | 7/2000 | Sturm et al. |
| 6,127,693 A * | 10/2000 | Chen et al. ............. 257/40 |
| 6,153,254 A | 11/2000 | Young et al. |
| 6,278,237 B1 * | 8/2001 | Campos ................. 313/512 |

FOREIGN PATENT DOCUMENTS

| | | |
|---|---|---|
| EP | 423283 | 1/1995 |
| EP | 758192 | 2/1997 |
| EP | 940796 | 9/1999 |
| EP | 940797 | 9/1999 |
| EP | 989778 | 3/2000 |
| WO | WO 90/13148 | 11/1990 |
| WO | WO 98/28946 | 7/1998 |
| WO | WO 98/53510 | 11/1998 |
| WO | WO 99/43031 | 8/1999 |
| WO | WO 99/66483 | 12/1999 |
| WO | WO 00/12226 | 3/2000 |
| WO | WO 00/19776 | 4/2000 |

* cited by examiner

Primary Examiner—Alicia Chevalier
(74) Attorney, Agent, or Firm—Leydig, Voit & Mayer, Ltd.

(57) ABSTRACT

A method for manufacturing matrix arrangements of organic conductive materials, especially in an organic light-emitting diode structure. In the method, an anode layer as well as a patterned photo-resist layer, having a pattern corresponding to a pixel matrix, are formed on a substrate. Then, a first organic material layer is formed and a cathode layer is vapor-deposited. Thereafter, the cathode layer and the first organic material layer located beneath the cathode layer are removed from an area where pixels of different kinds are to be formed, by laser ablation. Another organic material layer is formed and then a cathode layer is again vapor-deposited. Then, laser ablation is used to clean areas where pixels of still another different kind are to be formed. Formation of additional organic material layers and vapor-deposition of cathode layers in accordance with the number of different kinds of pixels are repeated.

16 Claims, 3 Drawing Sheets

MATRIX ARRANGEMENT OF ORGANIC MATERIAL LAYERS AND ELECTRODES INCLUDING PIXELS

BACKGROUND OF THE INVENTION

1. Field of the Invention

The present invention relates to a method for the manufacture of matrix arrangements, such as multi-color light emitting diode displays made from electro-luminescent polymers or low molecular weight luminescent materials (OLED), sensor panels, based on organic conductive materials, and products manufactured using the method,

2. Description of the Related Art

Methods of manufacturing organic polymer light emitting diodes are disclosed in EP 0423283, WO90/13148, and U.S. Pat. No. 5,869,350. Methods of manufacturing organic light emitting diodes based on low molecular weight luminescent materials are disclosed in U.S. Pat. Nos. 4,769,292 and 4,720,432.

Up to now, full-color polymer OLED's were manufactured by printing methods, such as using ink-jet printers. Corresponding methods are described in EP 0940796, EP 0940797, EP 0989778, WO 99/43031, WO 99/66483, WO 98/28946, U.S. Pat. No. 6,087,196, WO 00/12226, and WO 00/19776. In the method of ink-jet printing, a polymer drop is applied for each pixel of a display onto a substrate. The arrangement can be selected in such a way that the polymer drops lie between two electrodes in a common plane or the electrodes and polymer may be superimposed, in which case one electrode is made from a transparent material. With the arrangement of multi-color light emitting pixels in a matrix, a full color OLED screen is subsequently provided.

According to EP 090872, a sensor panel with various types of polymers is produced in the same manner. Polymer drops are jetted by an ink-jet printer between two neighboring microelectrodes on a substrate.

The light-producing efficiency of ink-jetted polymer films is considerably lower than in the case of spin-coated polymer layers. Moreover, there are special requirements for the polymer solution when the ink-jet method is used, such as the use of a high-boiling point solvent, high stability with regard to the drop formation, and good wetting coverage of the substrate surface as well as wetting coverage of the print heads. These requirements mandate complex optimization of existing polymer solutions. In addition, the substrate onto which the polymers are jetted must have pixel cavities into each of which a drop must be placed so that it does not come apart and run into a neighboring pixel cavity. With increasingly higher resolution for screens, increasingly smaller pixel cavities have to be prepared on the substrate, and these smaller pixel cavities are closer to each other than pixel cavities for lower resolution screens. In this case, a physical limit on cavity size is reached depending on the size of the drops of the polymer solution of a certain viscosity and corresponding print head technology. When the limit is exceeded, a drop will inevitably touch the neighboring pixel and the display is then unusable.

The manufacture of full color OLED's on the basis of low molecular weight luminescent materials is achieved by the evaporation of the luminescent materials with the use of shadow masks. This technique is described in U.S. Pat. Nos. 6,153,254 and 5,742,129. In this technique, to produce pixels for the various required colors, e.g., red, green and blue, different types of shadow masks have to be applied and this represents an additional cost factor. During the evaporation process, these shadow masks are subjected to thermal stress and, in addition, they become fouled over a period of time due to the evaporated substances. Thus, this technique requires complex and work-intensive cleaning of the shadow masks and regular replacement of the shadow masks. When using larger shadow masks for larger substrates, gravity represents an additional problem, as the shadow masks tend to sag with the result that the resolution in the middle of the substrate to be coated is no longer ensured.

The application of laser ablation in producing organic light emitting diodes is described in EP 0758192, WO 98/53510 as well as in Noah et al., Applied Physics Letters, Vol. 69, No. 24, 1996, pp. 3650–3652. With the application of laser ablation, OLED's can be manufactured with a stacked layer sequence of anode, light emitting layer, and cathode. In this case, a transparent anode layer is applied to a transparent substrate, and then onto this anode layer a correlated light emitting layer and a metallic cathode layer are sequentially applied. With a laser, the cathode layer and the light emitting layer are divided into separate pixels. The method is only suitable for the manufacture of individual OLED's or mono-color OLED displays, since they have a single type of light emitting layer of the same kind.

SUMMARY OF THE INVENTION

It is an object of the present invention to provide a method with which high-quality matrix arrangements of organic conductive materials, that is, with a high pixel resolution, can be manufactured with simplified technological means.

It is another object of the present invention to provide matrix arrangements manufactured by this method.

According to one aspect of the invention, a method for manufacturing a matrix of organic materials includes sequentially forming on a surface of an insulating substrate, a first electrode layer and a patterned separator layer defining at least first and second cells; sequentially forming a first organic material layer and a first second electrode layer covering all of the surface of the insulating substrate including the first electrode layer and the patterned separator; removing the first second electrode layer and the first organic material layer located beneath the first second electrode layer from the second cells by laser ablation; and sequentially forming a second organic material layer and a second second electrode layer covering all of the surface of the insulating substrate including the first electrode layer and the patterned separator.

According to a second aspect of the invention, a matrix arrangement comprises an insulating substrate; a first electrode layer covering a surface of the substrate; a separator defining and separating a plurality of first and second cells, on the first electrode layer; first pixels having a first organic material layer, a first second electrode layer, a second organic material layer, and a second second electrode layer sequentially stacked in the first cells, on the first electrode layer; and second pixels having the second organic material layer and the second second electrode layer sequentially stacked in the second cells, on the first electrode layer, spaced from the first cells by the separator.

In both the method and matrix array, in preferred embodiments, three kinds of pixels are formed and present, producing red, green, and blue light, respectively.

BRIEF DESCRIPTION OF THE DRAWINGS

The above objects and advantages of the present invention will become more apparent by describing in detail preferred embodiments with reference to the attached drawings in which.

DETAILED DESCRIPTION OF THE INVENTION

Figure 1:
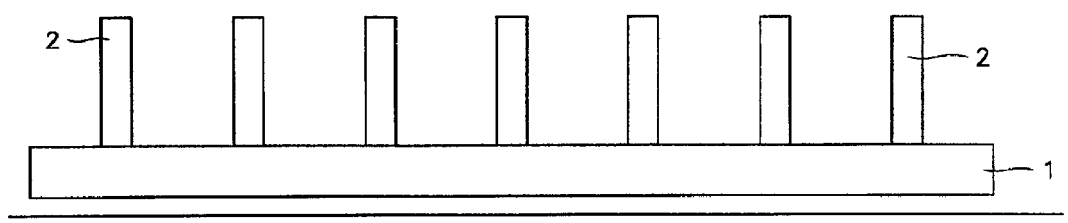
FIG. 1 shows an end or sectional view of a substrate of an OLED display pre-treated for processing according to the present invention.

A method for the manufacture of matrix arrangements according to the present invention and matrix arrangements manufactured by the method will now be described more fully with reference to the preferred embodiments.

The method includes a combination of spin-coating and vapor-depositing of organic materials, such as electroluminescent polymers and/or low molecular weight luminescent materials, and laser ablation.

For the manufacture of a full color screen, including respective pixels producing three different colors, eight steps or their equivalents are used. First of all, a glass substrate is used for organic light emitting diodes. This glass substrate is first coated with a transparent anode and, preferably, at least one of a hole injection layer and a hole transport layer, the latter of which may be polyethylene dihydroxy thiophene (PEDOT), polyaniline (PANI), or tetraphenyl diamine (TPD) and triarylamine. The transparent anode comprises at least one compound selected from the group consisting of indium tin oxide (ITO), indium oxide(IO), indium zirconium oxide (IZO), tin oxide(TO) and zirconium oxide(ZO), or a metal electrode thin enough for visible light to be transmitted. A patterned photo-resist layer is present on the hole transport layer. This photo-resist layer is used to form cells of a matrix into which, at a later stage, the electroluminescent polymers or low molecular weight luminescent materials are deposited.

With the use of luminescent polymers, for example, one of the polymers, such as a red-emitting polymer, is spin-coated onto the substrate covering all of the surface. Then, the cathode is vapor-deposited. In a typical manner, the cathode consists of LiF/Al, Ca/Ag, Ca/Al, LiF/Ca/Al, LiF/Ca/Ag, Yb/Al, Yb/Ag, LiF/Yb/Al, LiF/Yb/Ag or any other suitable cathode material. At least one of an electron injection and an electron transport layer is preferably interposed between the polymer and the cathode layer. Subsequently, the cells into which, at a later stage, other color-emitting polymers are to be applied, are cleared of the cathode and polymer by laser ablation. In this case, the power of the laser is set so that only cathode and electroluminescent polymer are ablated, and not the hole transport layer. This power limitation applies for all further ablation steps. In the next step, the second polymer, such as a green-emitting polymer, is spin-coated onto the substrate over all the surface. Thereafter, the cathode is again vapor-deposited. Then, the cells, to which, at a later stage, the other-color emitting polymers are to be applied, are cleared by laser ablation.

In the last steps, for example, a blue-emitting polymer is spin-coated onto the substrate or the anode surface. Thereafter, the cathode is again vapor-deposited onto the substrate over the entire surface. A full color OLED display is obtained by connecting contacts and the driving circuits of the individual cells, i.e., pixels.

The summary explanation of this method for producing pixels respectively producing red, green, and blue light is exemplary only. Rather than using the method described above and in the further explanation below for producing matrices including three kinds, i.e., different-color producing, of pixels, the method may be used to produce arrangements, e.g., matrices, with only two kinds of pixels or with more than three kinds of pixels.

The spin-coating method of applying polymer films is a technique which produces high quality light-emitting polymer films with regard to efficiency and homogeneity. Furthermore, the problem of positioning of polymer drops which occurs in the ink-jet printing method is eliminated. In addition, commercially available polymers or polymer solutions can be used in spin-coating without the necessity of optimizing or altering the solutions with regard to polymer drop formation. Moreover, with the existing laser technology, it is possible to ablate areas of sub-micrometer dimensions. As a result, screens with high resolution can be manufactured according to the invention without difficulty. Even the application of the ablation method to larger substrates is ensured because it is possible to scan a laser over all the substrate or to expand a laser beam into laser beams to such an extent that they scan over the entire area of a large substrate.

FIG. 1 shows a glass substrate 1 for the manufacture of a matrix of organic light emitting diodes, the substrate being coated with a transparent anode (not shown) of indium-tin-oxide (ITO) as well as a hole transport layer (not shown) of tetraphenyl diamine (TPD) and triarylamine and on which there is a patterned photo-resist layer 2. As shown in FIG. 1, an end or sectional view of the substrate and photoresist layer, the photo-resist layer 2 defines channels into which the individual light emitting layers (polymers or low molecular weight luminescent materials) are supplied. FIG. 1 and the other figures are end views of the substrate and photo-resist layer pattern. In preferred embodiments, the photo-resist layer 2 pattern is a lattice, defining a matrix of cells for pixels, arranged in rows and columns. Each cell defined by the matrix corresponds to a pixel. The references here to channels are not limited to relatively long linear stripes of polymer and cathode materials as may be interpreted from the end views, but also encompass cells in a matrix array defined by the photo-resist layer lattice. The cells may have any shape, such as rectangular, circular, or polygonal, that is determined when patterning the photo-resist layer to produce the structure shown end-on or in the sectional views of the figures.

Figure 2:
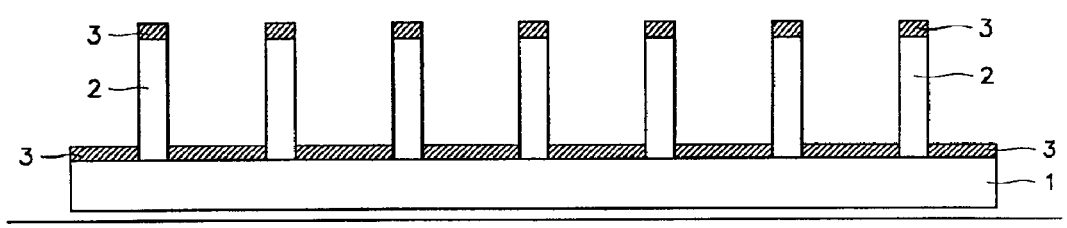
FIG. 2 shows the OLED display substrate after a first process step.

Referring to FIG. 2, a first electroluminescent polymer, e.g., the red-emitting polymer 3, is spin-coated onto the substrate 1 covering the entire surface of the substrate. Alternatively, a first low molecular weight luminescent material, e.g., the red-emitting luminescent material 3, is vapor-deposited onto the substrate 1, covering the entire surface.

Figure 3:
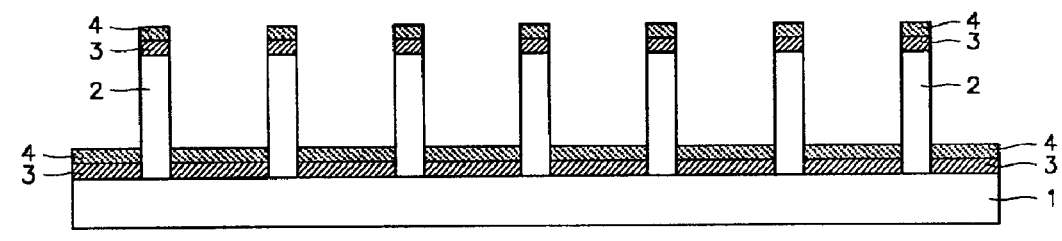
FIG. 3 shows the OLED display substrate after a second process step.

Referring to FIG. 3, a cathode layer 4 is vapor-deposited onto the substrate 1, covering the entire surface of the substrate.

Figure 4:
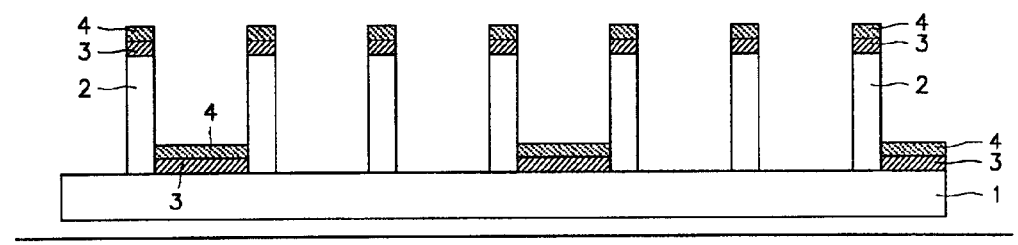
FIG. 4 shows the OLED display substrate after a third process step.

Referring to FIG. 4, the channels or cells in which, at a later stage, other color emitting polymers or low molecular weight luminescent materials are to be applied, are selectively cleared, i.e., the cathode layer 4 and the red-emitting material are removed, by laser ablation, from those channels or cells. In this case, the power of the laser is set so that only the cathode layer 4 and the red-emitting materials 3 are ablated, not the hole transport layer or transparent anode. This adjustment of laser power to remove only the two most recently deposited layers applies to all further ablation steps.

Figure 5:
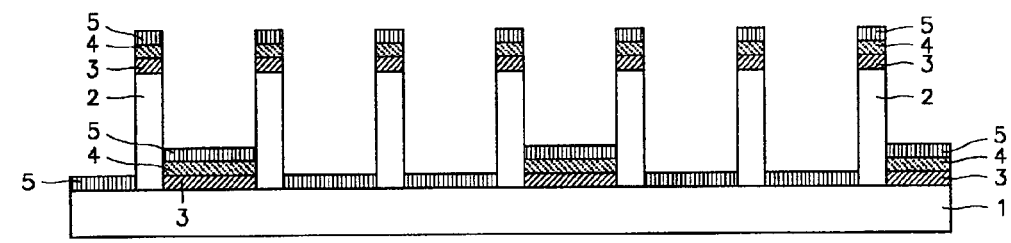
FIG. 5 shows the OLED display substrate after a fourth process step.

Referring to FIG. 5, a second luminescent polymer, e.g., a green-emitting luminescent polymer 5, is spin-coated onto the substrate 1, covering all of the surface. Alternatively, a second low molecular weight luminescent material, e.g., the green-emitting luminescent material 5, is vapor-deposited onto the substrate 1 covering all the surface.

Figure 6:
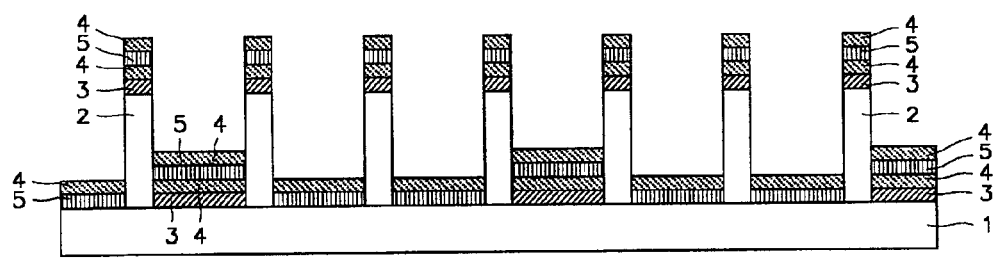
FIG. 6 shows the OLED display substrate after a fifth process step.

Referring to FIG. 6, the cathode layer 4 is again vapor-deposited onto and covering all of the substrate 1.

Figure 7:
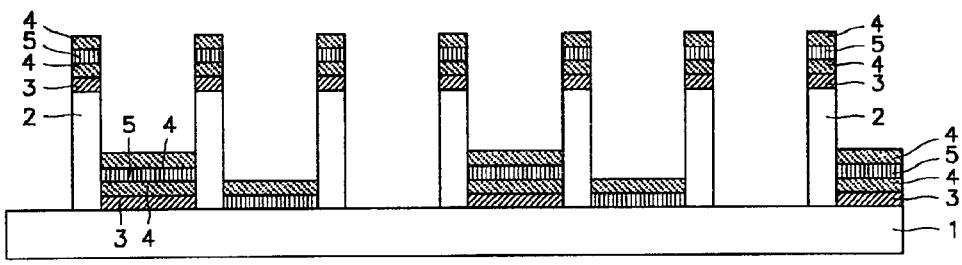
FIG. 7 shows the OLED display substrate after a sixth process step.

As shown in FIG. 7, the channels or cells, in which, at a later stage, a third color emitting low molecular weight luminescent material is to be applied, are cleared by laser ablation.

Figure 8:
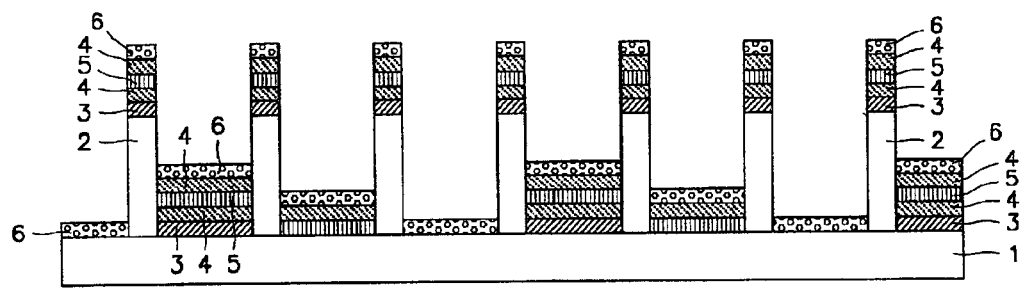
FIG. 8 shows the OLED display substrate after a seventh process step.

Referring to FIG. 8, a third luminescent polymer, a blue-emitting polymer 6 is spin-coated onto the substrate 1, covering the entire surface of the substrate.

Alternatively, a third low molecular weight luminescent material, the blue-emitting polymer 6, is vapor-deposited onto and entirely covering the surface of the substrate 1.

Figure 9:
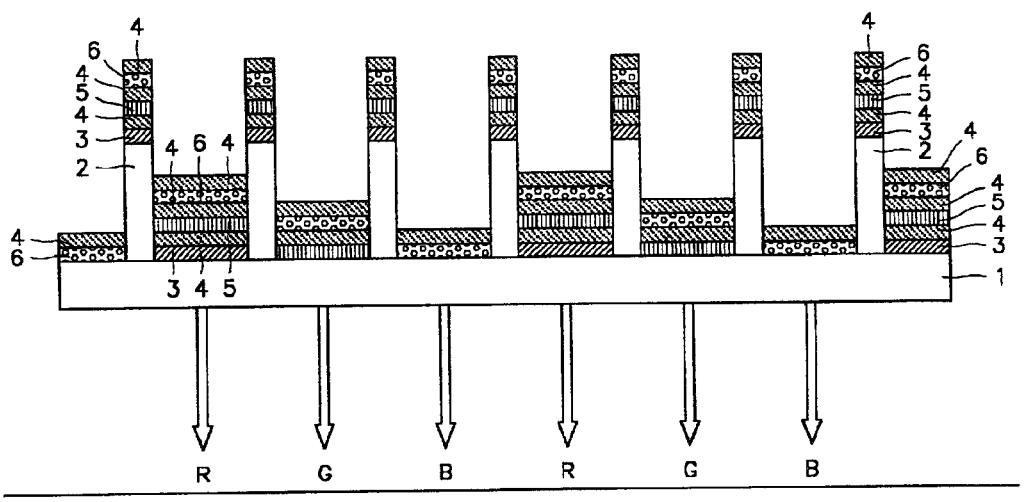
FIG. 9 shows a finished OLED display after an eighth process step.

Finally, referring to FIG. 9, the cathode layer 4 is vapor-deposited covering all of the substrate 1 (FIG. 9). A full-color OLED display is produced from this structure by connecting contacts to the respective exposed cathode layers in the respective channels or cells and the hole transport and transparent anode layers. These contacts are connected to driving circuits for the individual pixels.

According to the present invention, high-quality matrix arrangements with a high pixel resolution can be manufactured with a simplified method. Although a particular order of depositing the organic materials with respect to the color of light each material emits has been described, the order of deposition is not essential to the invention. Further, although the specific examples concern a method for producing and a structure with three kinds of pixels, i.e., including three different organic material layers, fewer than three or more than three different kinds of pixels may be prepared or be present in a structure according to the invention, without departing from the spirit or scope of the invention.

What is claimed is:

1. A matrix arrangement comprising:
   an electrically insulating substrate;
   an anode layer covering a surface of the substrate;
   a separator defining and separating respective pluralities of first and second cells, on the anode layer, from each other;
   first pixels including first and second organic light-emitting material layers, each first pixel comprising the first organic light-emitting material layer, a first cathode layer, the second organic light-emitting material layer, and a second cathode layer, sequentially stacked, in each of the first cells, on the anode layer; and
   second pixels including only the second of the first and second organic light-emitting material layers, each second pixel comprising the second organic light-emitting material layer and the second cathode layer, sequentially stacked, in each of the second cells, on the anode layer, and spaced from the first cells by the separator.

2. The matrix arrangement according to claim 1, wherein the anode layer is a transparent electrode comprising at least one material selected from the group consisting of indium tin oxide, indium oxide, indium zirconium oxide, tin oxide, zirconium oxide, and a metal layer for transmission of visible light.

3. The matrix arrangement according to claim 1, wherein the first and second organic light-emitting layers respectively comprise first and second organic materials producing respective different colors of light upon stimulation.

4. The matrix arrangement according to claim 1, including at least one of a hole injection layer and a hole transport layer between the anode layer and the first organic material.

5. The matrix arrangement according to claim 4, wherein the hole transport layer is at least one material selected from the group consisting of polyethylene dihydroxy thiophene, polyaniline, and tetraphenyl diamine and triarylamine.

6. The matrix arrangement according to claim 1, including at least one of an electron injection layer and an electron transport layer located at at least one of (i) between the first cathode layer and the first organic material layer and (ii) between the second cathode layer and the second organic material layer.

7. The matrix arrangement according to claim 1, wherein the first and second cathode layers are at least one mixture selected from the group consisting of LiF/Al, Ca/Ag, Ca/Al, LiF/Ca/Al, LiF/Ca/Ag, Yb/Al, Yb/Ag, LiF/Yb/Al, and LiF/Yb/Ag.

8. The matrix arrangement according to claim 1, wherein the separator is a photo-resist film.

9. A matrix arrangement comprising:
   an electrically insulating substrate;
   an anode layer covering a surface of the substrate;
   a separator defining and separating respective pluralities of first, second, and third cells on the anode layer from each other;
   first pixels including first, second, and third organic light-emitting material layers, each first pixel comprising the first organic light-emitting material layer, a first cathode layer, the second organic light-emitting material layer, a second cathode layer, the third organic light-emitting material layer, and a third cathode layer, sequentially stacked, in each of the first cells, on the anode layer;
   second pixels including only the second and third of the first, second and third organic light-emitting material layers, each second pixel comprising the second organic light-emitting material layer, the second cathode layer, the third organic light-emitting material layer, and the third cathode layer, sequentially stacked, in the second cells, on the anode layer, and spaced from the first cells by the separator; and
   third pixels including only the third of the first, second and third light-emitting organic material layers, each third pixel comprising the third organic light-emitting material layer and the third cathode layer, sequentially stacked, in each of the third cells, on the anode layer, and spaced from the second cells by the separator.

10. The matrix arrangement according to claim 9, wherein the anode layer is a transparent electrode comprising at least one material selected from the group consisting of indium tin oxide, indium oxide, indium zirconium oxide, tin oxide, zirconium oxide, and metal layer for transmission of visible light.

11. The matrix arrangement according to claim 9, wherein the first, second, and third organic light-emitting material layers comprise respective light-emitting materials producing respective different colors of light upon stimulation.

12. The matrix arrangement according to claim 9, including at least one of a hole injection layer and a hole transport layer between the anode layer and the first organic material.

13. The matrix arrangement according to claim 12, wherein the hole transport layer is at least one material selected from the group consisting of polyethylene dihydroxy thiophene, polyaniline, and tetraphenyl diamine and triarylamine.

14. The matrix arrangement according to claim 9, including at least one of an electron injection layer and an electron transport layer located at at least one of (i) between the first cathode layer and the first organic light-emitting material layer and (ii) between the second cathode layer and the second organic light-emitting material layer.

15. The matrix arrangement according to claim 9, wherein the first, second, and third cathode layers are at least one mixture selected from the group consisting of LiF/Al, Ca/Ag, Ca/Al, LiF/Ca/Al, LiF/Ca/Ag, Yb/Al, Yb/Ag, LiF/Yb/Al, and LiF/Yb/Ag.

16. The matrix arrangement according to claim 9, wherein the separator is a photo-resist film.

* * * * *